United States Patent
Ito et al.

(10) Patent No.: US 8,471,943 B2
(45) Date of Patent: Jun. 25, 2013

(54) STACKED ORGANIC LIGHT-EMITTING DEVICE, AND IMAGE DISPLAY APPARATUS AND DIGITAL CAMERA INCLUDING THE SAME

(75) Inventors: Naoyuki Ito, Yokohama (JP); Nobutaka Mizuno, Mobara (JP); Naoto Nakamura, Mobara (JP); Masami Iseki, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 122 days.

(21) Appl. No.: 12/999,998

(22) PCT Filed: Jun. 15, 2009

(86) PCT No.: PCT/JP2009/061255
§ 371 (c)(1),
(2), (4) Date: Dec. 17, 2010

(87) PCT Pub. No.: WO2009/154285
PCT Pub. Date: Dec. 23, 2009

(65) Prior Publication Data
US 2011/0085068 A1    Apr. 14, 2011

(30) Foreign Application Priority Data

Jun. 20, 2008  (JP) .................. 2008-162310
Apr. 6, 2009  (JP) .................. 2009-092307

(51) Int. Cl.
*H04N 5/222*   (2006.01)
(52) U.S. Cl.
USPC .............. 348/333.01; 348/374; 348/801

(58) Field of Classification Search
USPC .................... 348/333.1, 374, 801
See application file for complete search history.

(56) References Cited

U.S. PATENT DOCUMENTS

2005/0062408 A1 *  3/2005  Yoo et al. .................. 313/504
2005/0173700 A1    8/2005  Liao et al.

FOREIGN PATENT DOCUMENTS

| JP | 2004-079538 A | 3/2004 |
| JP | 2005-100928 A | 4/2005 |
| JP | 2005-174639 A | 6/2005 |
| JP | 2005174639 A * | 6/2005 |
| JP | 2007-523451 A | 8/2007 |
| WO | 2006/040717 A1 | 4/2006 |
| WO | 2007-083918 A | 7/2007 |

* cited by examiner

*Primary Examiner* — Usman Khan
(74) *Attorney, Agent, or Firm* — Canon U.S.A., Inc., IP Division

(57) ABSTRACT

Provided is a stacked organic light-emitting device in which organic compound layers for respective emission colors are capable of separately emitting light. The stacked organic light-emitting device includes a first organic compound layer, a second organic compound layer, and a third organic compound layer, which have emission colors different from each other. The first organic compound layer is provided on one side of a common transparent electrode, and the second organic compound layer and the third organic compound layer are provided on another side thereof. The first organic compound layer has a polarity direction opposite to polarity directions of the second organic compound layer and the third organic compound layer.

18 Claims, 6 Drawing Sheets

STACKED ORGANIC LIGHT-EMITTING DEVICE, AND IMAGE DISPLAY APPARATUS AND DIGITAL CAMERA INCLUDING THE SAME

TECHNICAL FIELD

The present invention relates to a stacked organic light-emitting device, and an image display apparatus and a digital camera including the stacked organic light-emitting device.

BACKGROUND ART

Among organic light-emitting devices, as described in Japanese Patent Application Laid-Open No. 2005-174639, there has been known an organic light-emitting device in which organic compound layers having different emission colors are stacked to realize light emission of multiple colors. Specifically, in an organic electroluminescence (EL) apparatus described in Japanese Patent Application Laid-Open No. 2005-174639, one pixel includes multiple sub-pixels arranged in parallel to each other, and organic compound layers having different emission colors are stacked in each of the multiple sub-pixels. In a first sub-pixel, a first organic compound layer, a common electrode, a second organic compound layer, and a third electrode are sequentially stacked on a first electrode. In a second sub-pixel, a third organic compound layer, a common electrode, the second organic compound layer, and the third electrode are sequentially stacked on the first electrode. Then, the first electrode and the third electrode are electrically connected and supplied with the same potential.

In order to cause the respective organic compound layers to emit light, the following display apparatus has been proposed. In a case where the first or third organic compound layer is caused to emit light, a positive voltage is applied to the first electrode whereas a negative voltage is applied to the common electrode. In a case where the second organic compound layer is caused to emit light, a negative voltage is applied to the third electrode (and first electrode) whereas a positive voltage is applied to the common electrode. In this manner, the display apparatus operates by time-division driving. In a case where a mixed color is to be obtained, an alternating voltage is applied between the first electrode and the common electrode.

In the structure of the sub-pixels included in the organic EL apparatus described in Japanese Patent Application Laid-Open No. 2005-174639, when the time-division driving is adopted, a duty ratio reaches at most 50%. Based on the fact that the duty ratio cannot be increased, the sub-pixels need to be driven at high luminance correspondingly in order to obtain a desired emission luminance. As a result, the luminescence lifetime of an organic EL device is shortened.

DISCLOSURE OF THE INVENTION

In view of the above-mentioned problem, a stacked organic light-emitting device according to the present invention includes:
a first organic compound layer;
a second organic compound layer;
a third organic compound layer; and
a common transparent electrode,
the first organic compound layer, the second organic compound layer, and the third organic compound layer having emission colors different from each other,
wherein the first organic compound layer and the second organic compound layer are stacked via the common transparent electrode,
wherein the first organic compound layer and the third organic compound layer are stacked via the common transparent electrode,
wherein the first organic compound layer, the second organic compound layer, and the third organic compound layer separately emit light,
wherein the first organic compound layer has a polarity direction opposite to a polarity direction of the second organic compound layer, and
wherein the first organic compound layer has the polarity direction opposite to a polarity direction of the third organic compound layer.

According to the present invention, in the stacked organic light-emitting device including the first organic compound layer, the second organic compound layer, and the third organic compound layer, which have emission colors different from each other, the respective organic compound layers can separately emit light irrespective of driving periods of other organic compound layers.

BEST MODE FOR CARRYING OUT THE INVENTION

Figure 1:
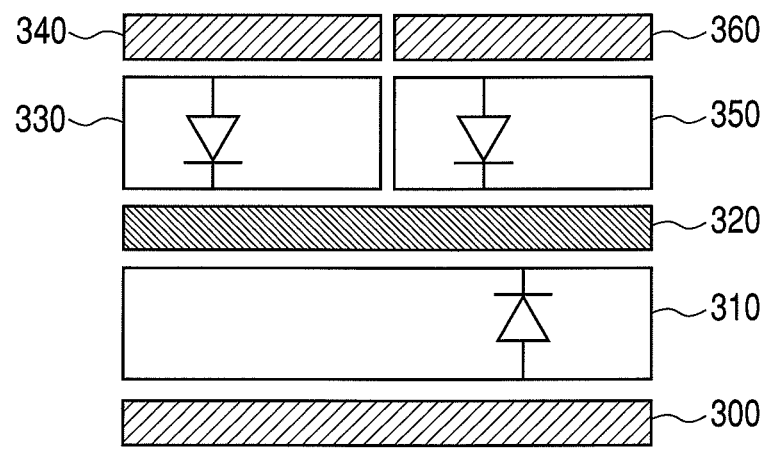
FIG. 1 is a schematic view illustrating a stacked organic light-emitting device according to a first embodiment of the present invention.

A stacked organic light-emitting device according to the present invention includes a first organic compound layer, a second organic compound layer, and a third organic compound layer, that is, includes three unit devices. Specifically, the stacked organic light-emitting device according to the present invention includes: a unit device formed of a first electrode, the first organic compound layer, and a common transparent electrode; a unit device formed of a second electrode, the second organic compound layer, and the common transparent electrode; and a unit device formed of a third electrode, the third organic compound layer, and the common transparent electrode. Those unit devices have emission colors different from each other.

The first organic compound layer is provided between the first electrode and the common transparent electrode. The second organic compound layer is provided between the common transparent electrode and the second electrode. The third organic compound layer is provided between the common transparent electrode and the third electrode. In other words, in the stacked organic light-emitting device according to the present invention, the first organic compound layer and the second organic compound layer are stacked via the common transparent electrode, and the first organic compound layer and the third organic compound layer are stacked via the common transparent electrode. Furthermore, the second organic compound layer and the third organic compound layer are spaced apart from each other in a direction parallel to a substrate.

In addition, the common transparent electrode represents an electrode extending over a region between the first organic compound layer and the second organic compound layer and also over a region between the first organic compound layer and the third organic compound layer. The common transparent electrode is transparent with respect to light emitted from the respective unit devices, that is, light emitted from the respective organic compound layers.

Moreover, the common transparent electrode is a component common to all the unit devices. Therefore, one electrode of each of the unit devices has the same potential among the unit devices. A polarity direction of the first organic compound layer is opposite to a polarity direction of the second organic compound layer. The polarity direction of the first organic compound layer is also opposite to a polarity direction of the third organic compound layer. With this structure, the organic compound layers, which are opposed to each other via the common transparent electrode, can be separately driven, that is, can separately emit light. As a result, an upper limit of a duty ratio of each organic compound layer can exceed 50% to reach up to 100%.

The duty ratio of the organic compound layer here means a duty ratio serving as a driving condition for the unit device in which a pair of electrodes and the organic compound layer disposed between the pair of electrodes are provided.

The polarity direction of the organic compound layer here means a direction in which a current flows on the assumption that the unit device is a light-emitting diode. Specifically, when the first electrode is an anode and the common transparent electrode is a cathode, the direction in which a current flows, that is, a direction in which holes advance corresponds to the polarity direction of the organic compound layer.

The layer structure of each organic compound layer may be any one of a single-layer type (light-emitting layer), a two-layer type (hole transport layer/light-emitting layer or light-emitting layer/electron transport layer), and a three-layer type (hole transport layer/light-emitting layer/electron transport layer). The layer structure of each organic compound layer may also be any one of a four-layer type (for example, hole injection layer/hole transport layer/light-emitting layer/electron injection layer) and a five-layer type (hole injection layer/hole transport layer/light-emitting layer/electron transport layer/electron injection layer). The first to third organic compound layers may have composition and layer structures different from each other.

When the stacked organic light-emitting device according to the present invention is provided on a substrate that does not transmit light, light can be extracted from a side opposite to a side on which the substrate is provided, with respect to the common transparent electrode, and a side opposed to the substrate, that is, a side on which the substrate is not provided.

The material of the substrate is not particularly limited and may be an organic or inorganic substance. In the case of the organic substance, for example, a flexible substrate can be used for the substrate. In the case of the inorganic substance, for example, glass can be used for the substrate.

The substrate may be made of a member that transmits light emitted from the organic compound layer or a member that does not transmit the light emitted therefrom. With the use of the member that transmits light, light may be extracted from the side on which the substrate is provided. Alternatively, there may be used for the substrate a member obtained by forming active elements such as a thin film transistor for driving the unit device on a light-transmitting member such as glass, and further providing other members thereon so that the member does not transmit light substantially.

According to embodiments of the present invention, there can be provided an image display apparatus in which the stacked organic light-emitting device according to the present invention is provided in plurality in a display region. The image display apparatus includes switching elements each provided correspondingly one by one to the stacked organic light-emitting devices. The switching element is, for example, a thin film transistor. The image display apparatus desirably employs active-matrix driving but may employ simple-matrix driving.

More specifically, the image display apparatus described above is, for example, a display of a personal computer or the like, a television, a display apparatus for advertisement in a train, or a car navigation system installed in an automobile. Furthermore, the image display apparatus may be employed for a display unit of a driver's seat in an automobile or a display unit of a mobile phone. Alternatively, the image display apparatus may be employed for an operation panel portion of an electrophotographic image forming apparatus such as a laser printer or copying machine. Still alternatively, the image display apparatus may be employed for a display unit of an imaging apparatus such as a still camera or digital camcorder. The imaging apparatus includes an imaging unit and the display unit. The imaging apparatus is not limited to a still camera or digital camcorder and is particularly desirably a digital camera.

(First Embodiment)

FIG. 1 is a schematic view illustrating a stacked organic light-emitting device according to this embodiment. The stacked organic light-emitting device according to this embodiment has a structure in which one pixel includes multiple sub-pixels disposed in parallel to each other.

One pixel includes the multiple sub-pixels arranged in parallel to each other. The multiple sub-pixels include multiple stacked organic compound layers having different emission colors. For example, a first sub-pixel (illustrated on a left side of FIG. 1) is formed of a unit device that emits blue light and a unit device that emits green light. A second sub-pixel (illustrated on a right side of FIG. 1) is formed of the unit device that emits blue light and a unit device that emits red light. The polarity direction of the organic compound layer of the unit device having blue light emission (hereinafter, referred to as blue device) is opposite to the polarity directions of the organic compound layers of the unit device having green light emission (hereinafter, referred to as green device) and the unit device having red light emission (hereinafter, referred to as red device). An electrode provided between the organic compound layer of the blue device and the organic compound layer of the green device and also between the organic compound layer of the blue device and the organic compound layer of the red device is formed of a common transparent electrode. In the following description, the structure example described above is employed, but the types or combination of emission colors of the organic compound layers is not limited thereto.

A second organic compound layer 330 forming the green device has the same polarity direction as that of a third organic compound layer 350 forming the red device. Specifically, in a direction in which a first organic compound layer 310 and the second organic compound layer 330 (or third organic compound layer 350) are stacked on each other, functional layers of the second organic compound layer 330 and functional layers of the third organic compound layer 350 are stacked in the same order.

The first organic compound layer 310 forming the blue device has the polarity direction opposite to those of the second organic compound layer 330 and the third organic compound layer 350. Specifically, in the direction in which the first organic compound layer 310 and the second organic compound layer 330 (or third organic compound layer 350) are stacked on each other, functional layers of the first organic compound layer 310 and the functional layers of the second organic compound layer 330 (or third organic compound layer 350) are stacked in the reverse order.

Figure 2A:
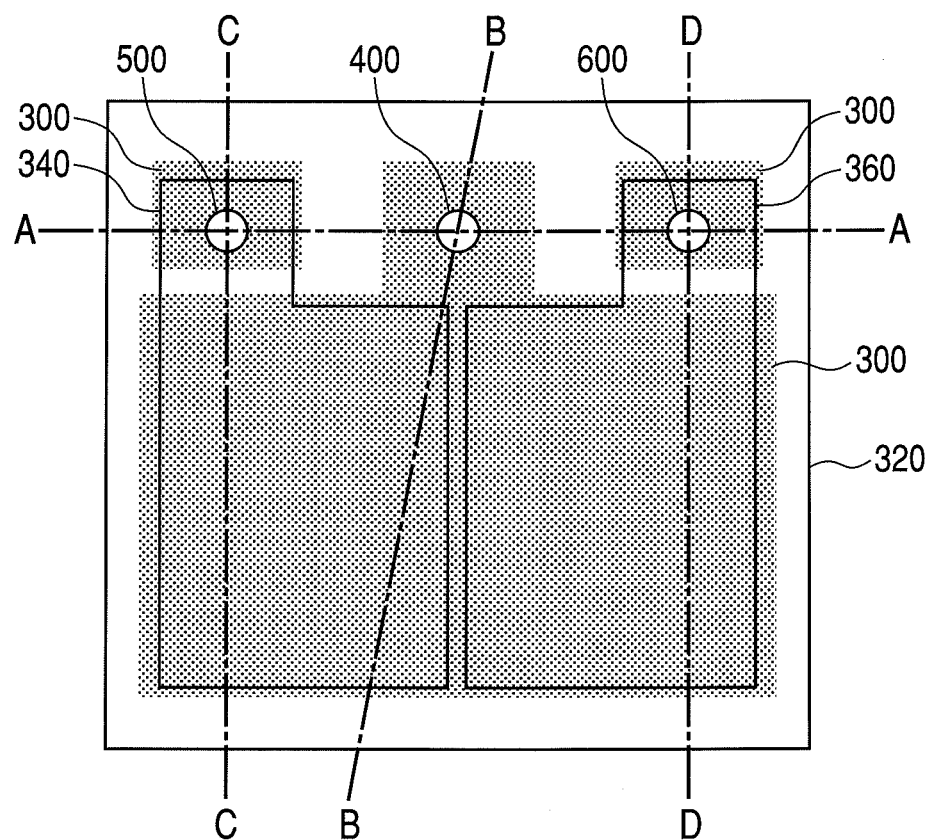
FIG. 2A is an x-y plan view illustrating electrodes of the stacked organic light-emitting device according to the first embodiment of the present invention.
Figure 2B:
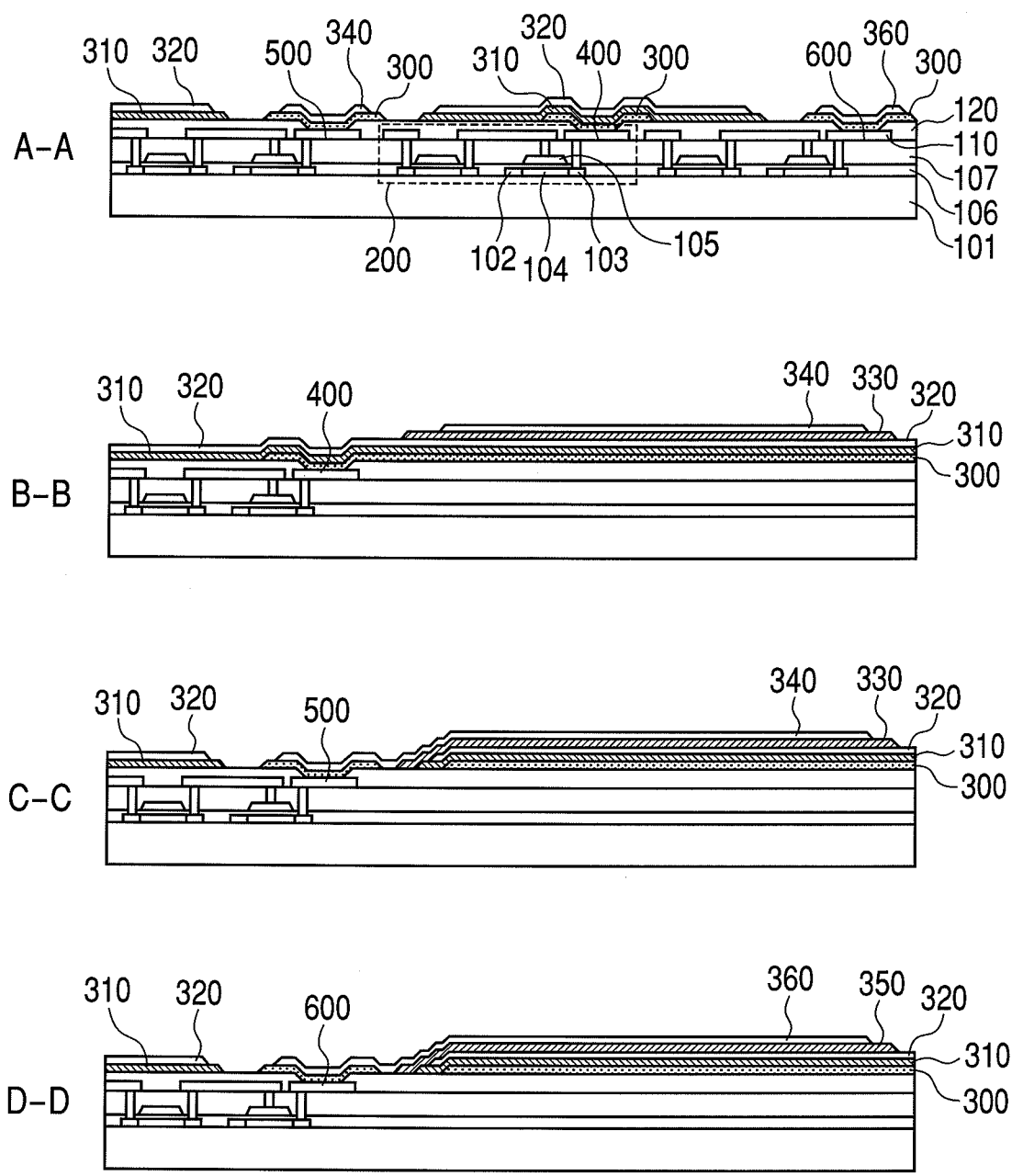
FIG. 2B are schematic cross-sectional views respectively taken along lines A-A, B-B, C-C, and D-D of FIG. 2A.

FIG. 2A is an x-y plan view illustrating electrodes according to this embodiment. FIG. 2B are cross-sectional views respectively taken along lines A-A, B-B, C-C, and D-D of FIG. 2A. FIG. 2A is a view corresponding to the first sub-pixel formed of the blue device and the green device and the second sub-pixel formed of the blue device and the red device. Those two sub-pixels serve to display a full-color image. FIG. 2B illustrate a glass substrate 101 which is not illustrated in FIG. 2A and provided on the far side of FIG. 2A. An active pixel circuit which uses a thin film transistor (hereinafter, referred to as TFT) 200 as an active element is provided on a main surface of the glass substrate 101. An insulating layer 120 is formed in an upper layer of the pixel circuit.

The TFT 200 has the structure as illustrated in the cross-sectional view of FIG. 2B taken along the line A-A of FIG. 2A. Specifically, on the glass substrate 101, a poly-Si layer 104 is formed in an insulating layer 106, and a source region 102 and a drain region 103 are formed in the poly-Si layer 104. Furthermore, a gate electrode 105 is formed above the poly-Si layer 104. Then, an insulating layer 107 is provided on the gate electrode 105, and a drain electrode 110 electrically connected to the drain region 103 is formed on the insulating layer 107. The TFT 200 is not limited to a top-gate type TFT as illustrated in FIG. 2B and may be a bottom-gate type TFT. The TFT 200 may have p-type characteristics or n-type characteristics. Among the electrodes forming the respective unit devices, electrodes other than common transparent electrodes are electrically connected to the TFTs 200 different from each other through electrode contact portions illustrated in FIG. 2A. A common transparent electrode 320 is connected to a constant voltage source (not shown). FIG. 2A illustrates a first electrode contact portion 400, a second electrode contact portion 500, and a third electrode contact portion 600.

As illustrated in the cross-sectional views of FIG. 2B respectively taken along the lines A-A and B-B of FIG. 2A, a first electrode 300 having a high reflectivity is provided on the drain electrode 110, and the first organic compound layer 310 and the common transparent electrode 320 are sequentially stacked thereon. As a result, the blue device is formed. The first electrode 300 is electrically connected to the TFT 200 through the first electrode contact portion 400. In this case, when the TFT 200 is a p-type TFT, the functional layers of the first organic compound layer 310 can be stacked in the following order from the glass substrate 101 side: a hole injection layer/a hole transport layer/a light-emitting layer/an electron transport layer/an electron injection layer. The first organic compound layer 310 can be formed over an entire display region by evaporation or the like.

Examples of the electrode having a high reflectivity can include a stacked member having a reflective film such as AlSi serving as a base and a transparent conductive film such as ITO stacked thereon, in addition to an electrode per se formed of a light-reflecting member.

The second organic compound layer 330 is further stacked on the common transparent electrode 320, and a second electrode 340 for driving the green device is stacked on the second organic compound layer 330. As illustrated in the cross-sectional views of FIG. 2B respectively taken along the lines A-A and C-C of FIG. 2A, the second electrode 340 is electrically connected to the TFT 200 through the second electrode contact portion 500. In this case, when the TFT 200 is a p-type TFT, the functional layers of the second organic compound layer 330 can be stacked in the following order from the glass substrate 101 side: the electron injection layer/the electron transport layer/the light-emitting layer/the hole transport layer/the hole injection layer. The second electrode contact portion 500 is formed by removing the first organic compound layer 310, the common transparent electrode 320, and the second organic compound layer 330 with the use of laser after the formation of those components. The second electrode contact portion 500 may be formed by a method in which the first organic compound layer 310, the common transparent electrode 320, and the second organic compound layer 330 are not previously formed or a method in which at least one of the first organic compound layer 310, the common transparent electrode 320, and the second organic compound layer 330 is formed and the formed component is removed.

Similarly, the third organic compound layer 350 is stacked on the common transparent electrode 320, and a third electrode 360 for driving the red device is stacked on the third organic compound layer 350. As illustrated in the cross-sectional views of FIG. 2B respectively taken along the lines A-A and D-D of FIG. 2A, the third electrode 360 is electrically connected to the TFT 200 through the third electrode contact portion 600. In this case, when the TFT 200 is a p-type TFT, the functional layers of the third organic compound layer 350 can be stacked in the following order from the glass substrate 101 side: the electron injection layer/the electron transport layer/the light-emitting layer/the hole transport layer/the hole injection layer. The third electrode contact portion 600 is formed by the same method as that for the second electrode contact portion 500 described above.

The first electrode 300, the second electrode 340, and the third electrode 360 are electrically connected to the TFTs 200 different from each other through the first electrode contact portion 400, the second electrode contact portion 500, and the third electrode contact portion 600, respectively.

As illustrated in FIGS. 2A and 2B, the second organic compound layer 330 and the third organic compound layer 350 are patterned by a known mask evaporation process so as to be formed only in a region in which the second organic compound layer 330 and the third organic compound layer 350 need to be formed. The area of the first organic compound layer 310 is larger than those of the second organic compound layer 330 and the third organic compound layer 350. The organic compound layer having a large area and the other two organic compound layers each having an area smaller than the large area are provided in a thickness direction thereof. As a result, in-plane integration and an aperture ratio of the organic light-emitting device or an image display apparatus including the multiple organic light-emitting devices can be improved.

When the stacked organic light-emitting device having the above-mentioned structure is provided in plurality in a plane, the first organic compound layer 310 may extend into an interval region between which the adjacent stacked organic light-emitting devices are located. In this case, the first organic compound layer 310 may be provided over an entire region in which the multiple stacked organic light-emitting devices are provided (corresponding to a display region in the case of the image display apparatus).

Similarly, the common transparent electrode 320 may extend into the interval region between which the adjacent stacked organic light-emitting devices are located. Furthermore, the common transparent electrode 320 may be provided over the entire region in which the multiple stacked organic light-emitting devices are provided (corresponding to the display region in the case of the image display apparatus).

(Second Embodiment)

Figure 3:
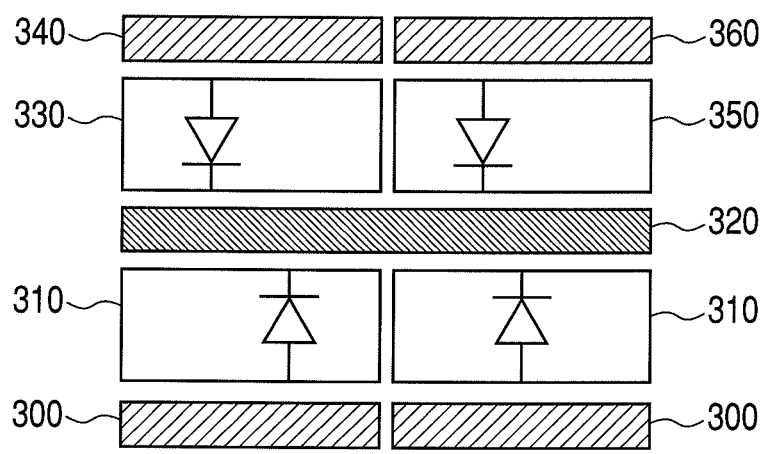
FIG. 3 is a schematic view illustrating a stacked organic light-emitting device according to a second embodiment of the present invention.

FIG. 3 is a schematic view illustrating a stacked organic light-emitting device according to this embodiment. According to this embodiment, two blue devices each formed of a different sub-pixel can be separately driven, which enables display at higher resolution. For a specific structure, the two first electrodes 300 are spaced apart from each other between the two sub-pixels. Furthermore, in order to apply a voltage separately to the two first electrodes 300, the two first electrodes 300 are electrically connected to the different TFTs 200 through the first electrode contact portions 400 different from each other. The second embodiment is the same as the first embodiment except for the above-mentioned structure. In FIG. 3, the first organic compound layers 310 are spaced apart from each other between the two sub-pixels. Alternatively, the continuous first organic compound layer 310 may be provided over the interval region between the sub-pixels.

Figure 4A:
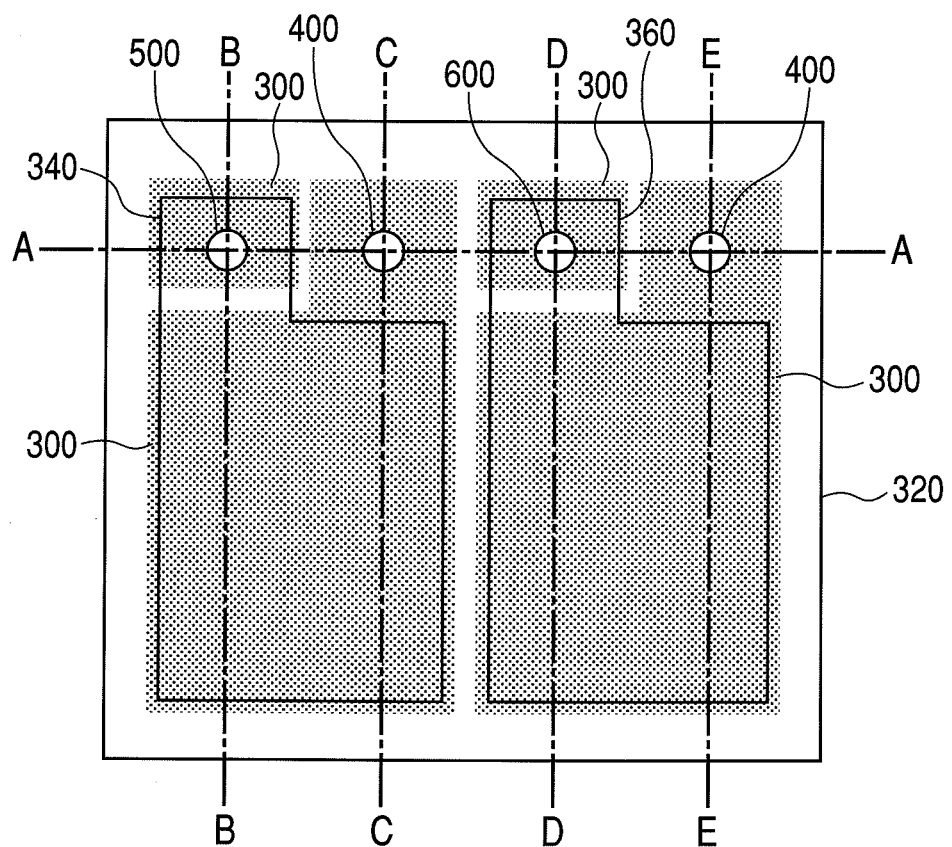
FIG. 4A is an x-y plan view illustrating electrodes of the stacked organic light-emitting device according to the second embodiment of the present invention.
Figure 4B:
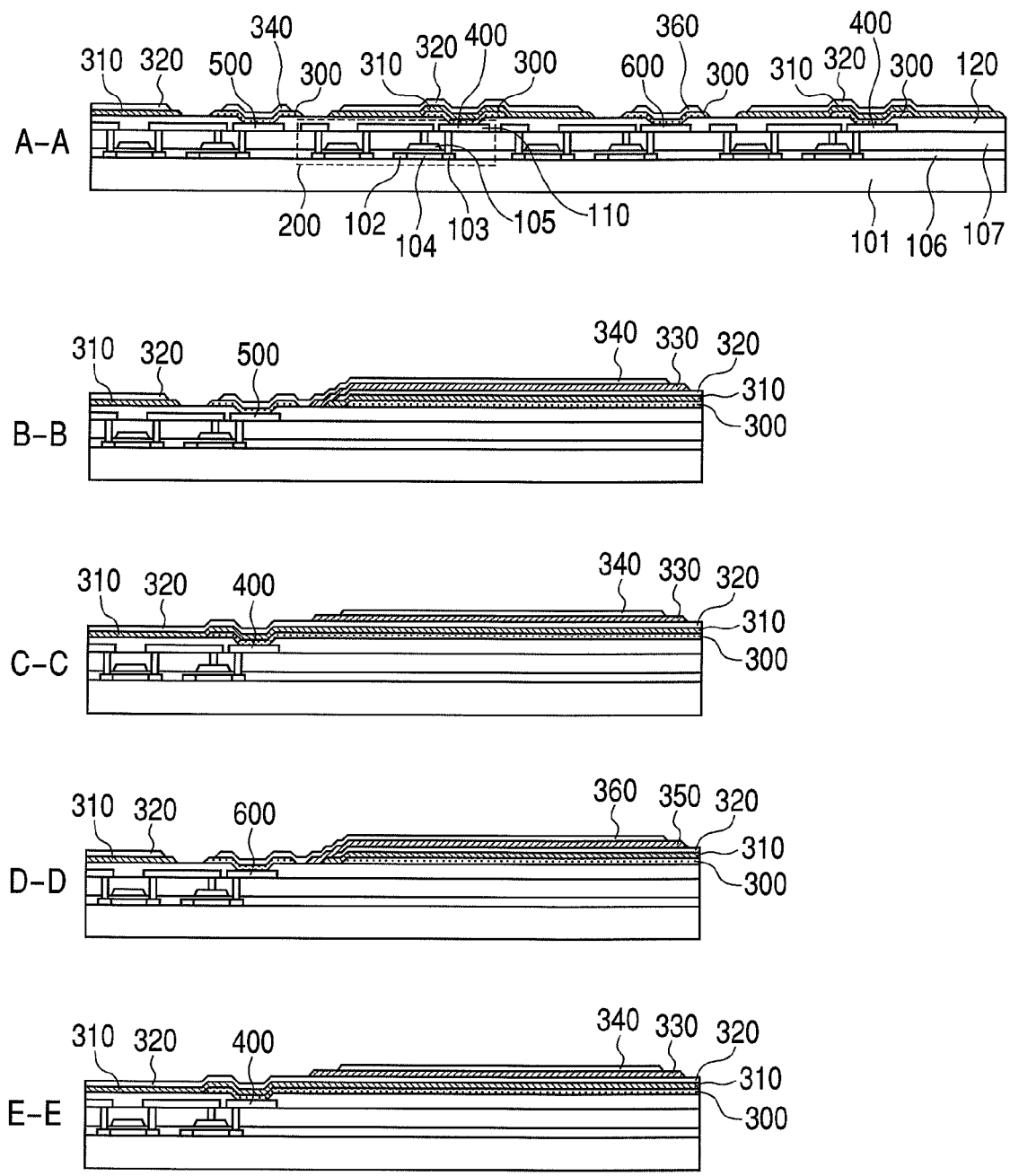
FIG. 4B are schematic cross-sectional views respectively taken along lines A-A, B-B, C-C, D-D, and E-E of FIG. 4A.

FIG. 4A is an x-y plan view illustrating electrodes of the stacked organic light-emitting device according to this embodiment. FIG. 4B are cross-sectional views respectively taken along lines A-A, B-B, C-C, D-D, and E-E of FIG. 4A. FIG. 4A is a view corresponding to the first sub-pixel formed of the blue device and the green device and the second sub-pixel formed of the blue device and the red device. The blue device of the first sub-pixel and the blue device of the second sub-pixel are separately driven, whereby those two sub-pixels serve to display a full-color image.

(Third Embodiment)

Figure 5:
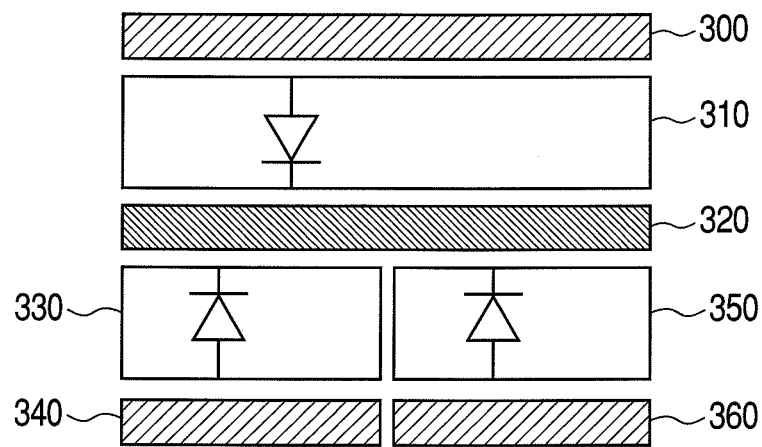
FIG. 5 is a schematic view illustrating a stacked organic light-emitting device according to a third embodiment of the present invention.

FIG. 5 is a schematic view illustrating a stacked organic light-emitting device according to this embodiment. The third embodiment is different from the first embodiment in that the first organic compound layer 310, the second organic compound layer 330, and the third organic compound layer 350 are stacked on the glass substrate 101 in the reverse order to that of the first embodiment. Specifically, the first organic compound layer 310 is stacked above the second organic compound layer 330 and the third organic compound layer 350 via the common transparent electrode 320. The third embodiment is the same as the first embodiment except for the above-mentioned structure.

Figure 6A:
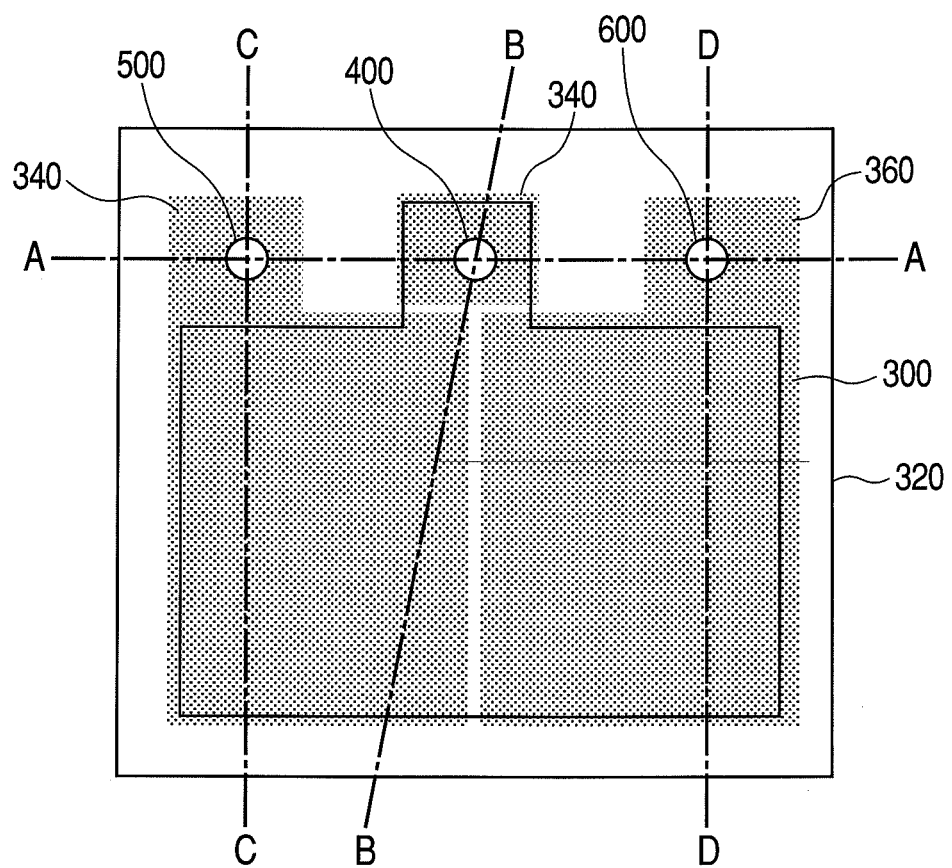
FIG. 6A is an x-y plan view illustrating electrodes of the stacked organic light-emitting device according to the third embodiment of the present invention.
Figure 6B:
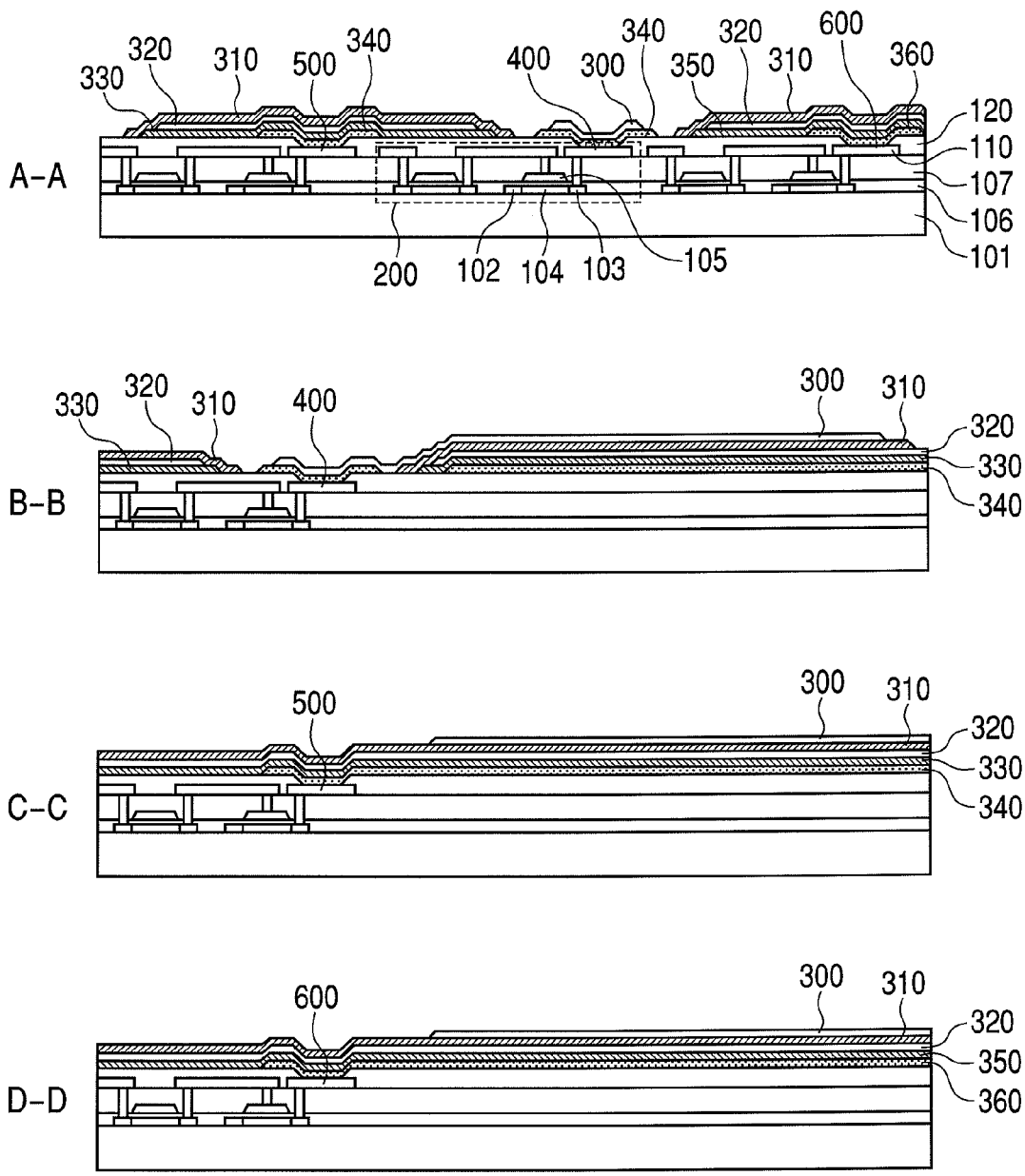
FIG. 6B are schematic cross-sectional views respectively taken along lines A-A, B-B, C-C, and D-D of FIG. 6A.

FIG. 6A is an x-y plan view illustrating electrodes of the stacked organic light-emitting device according to this embodiment. FIG. 6B are cross-sectional views respectively taken along lines A-A, B-B, C-C, and D-D of FIG. 6A. FIG. 6A is a view corresponding to the first sub-pixel formed of the green device and the blue device and the second sub-pixel formed of the red device and the blue device. The green device and the blue device of the first sub-pixel and the red device and the blue device of the second sub-pixel are separately driven, whereby those two sub-pixels serve to display a full-color image.

This application claims the benefit of Japanese Patent Applications No. 2008-162310, filed Jun. 20, 2008, and No. 2009-092307, filed Apr. 6, 2009, which are hereby incorporated by reference herein in their entirety.

The invention claimed is:

1. A stacked organic light-emitting element, comprising:
a first organic compound layer;
a second organic compound layer;
a third organic compound layer; and
a common transparent electrode,
the first organic compound layer, the second organic compound layer, and the third organic compound layer having emission colors different from each other and directly contacting the common transparent electrode,
wherein the first organic compound layer and the second organic compound layer are stacked via the common transparent electrode,
wherein the first organic compound layer and the third organic compound layer are stacked via the common transparent electrode,
wherein the first organic compound layer, the second organic compound layer, and the third organic compound layer separately emit light,
wherein the first organic compound layer has a polarity direction opposite to a polarity direction of the second organic compound layer,
wherein the first organic compound layer has the polarity direction opposite to a polarity direction of the third organic compound layer, and
wherein the first organic compound layer, the second organic compound layer and the third organic compound layer each have functional layers including a light-emitting layer, a hole transport layer and an electron transport layer, and wherein in a direction in which the first organic compound layer and the second organic compound layer are stacked, the stacking order of the functional layers of the first organic compound layer and the stacking order of the functional layers of the second organic compound layer are reverse to each other, and the stacking order of the functional layers of the first organic compound layer and the stacking order of the functional layers of the third organic compound layer are reverse to each other.

2. The stacked organic light-emitting element according to claim 1, further comprising:
a first electrode;
a second electrode;
a third electrode; and
a plurality of switching elements,
wherein the first organic compound layer is provided between the first electrode and the common transparent electrode,
wherein the second organic compound layer is provided between the second electrode and the common transparent electrode,
wherein the third organic compound layer is provided between the third electrode and the common transparent electrode, and
wherein each of the first electrode, the second electrode, and the third electrode is electrically connected to a different one of the plurality of switching elements.

3. An image display apparatus comprising the stacked organic light-emitting element set forth in claim 1, wherein the stacked organic light-emitting element is provided in plurality in a display region of the image display apparatus.

4. A digital camera comprising:
a display unit comprising the stacked organic light-emitting element set forth in claim 1 in plurality; and
an imaging unit.

5. The stacked organic light-emitting element according to claim 1, further comprising a substrate, wherein the second organic compound layer and the third organic compound layer are disposed parallel to each other in an in-plane direction of the substrate.

6. The stacked organic light-emitting element according to claim 1, wherein the first organic compound layer is formed extending over the entire region of the stacked organic light-emitting element.

7. The image display apparatus according to claim 3, wherein the first organic compound layer is formed extending over the entirety of the display region.

8. The stacked organic light-emitting element according to claim 1, wherein the common transparent electrode is formed extending over the entire region of the stacked organic light-emitting element.

9. The image display apparatus according to claim 3, wherein the common transparent electrode is formed extending over the entirety of the display region.

10. A stacked organic light-emitting element, comprising:
a first unit element comprising a first electrode, a first organic compound layer and a common transparent electrode;
a second unit element comprising a second electrode, a second organic compound layer and the common transparent electrode; and
a third unit element comprising a third electrode, a third organic compound layer and the common transparent electrode;
the first organic compound layer, the second organic compound layer and the third organic compound layer having emission colors different from each other,
wherein the first organic compound layer and the second organic compound layer are stacked via the common transparent electrode,
wherein the first organic compound layer and the third organic compound layer are stacked via the common transparent electrode,
wherein the first organic compound layer, the second organic compound layer, and the third organic compound layer separately emit light,
wherein the first organic compound layer has a polarity direction opposite to a polarity direction of the second organic compound layer,
wherein the first organic compound layer has the polarity direction opposite to a polarity direction of the third organic compound layer, and
wherein the first organic compound layer, the second organic compound layer and the third organic compound layer each have functional layers including a light-emitting layer, a hole transport layer and an electron transport layer, and wherein in a direction in which the first organic compound layer and the second organic compound layer are stacked, the stacking order of the functional layers of the first organic compound layer and the stacking order of the functional layers of the second organic compound layer are reverse to each other, and the stacking order of the functional layers of the first organic compound layer and the stacking order of the functional layers of the third organic compound layer are reverse to each other.

11. The stacked organic light-emitting element according to claim 10, further comprising:
a plurality of switching elements,
wherein the first organic compound layer is provided between the first electrode and the common transparent electrode,
wherein the second organic compound layer is provided between the second electrode and the common transparent electrode,
wherein the third organic compound layer is provided between the third electrode and the common transparent electrode, and
wherein each of the first electrode, the second electrode, and the third electrode is electrically connected to a different one of the plurality of switching elements.

12. An image display apparatus comprising the stacked organic light-emitting element set forth in claim 10, wherein the stacked organic light-emitting element is provided in plurality in a display region of the image display apparatus.

13. A digital camera comprising:
a display unit comprising the stacked organic light-emitting element set forth in claim 10 in plurality; and
an imaging unit.

14. The stacked organic light-emitting element according to claim 10, further comprising a substrate, wherein the second organic compound layer and the third organic compound layer are disposed parallel to each other in an in-plane direction of the substrate.

15. The stacked organic light-emitting element according to claim 10, wherein the first organic compound layer is formed extending over the entire region of the stacked organic light-emitting element.

16. The image display apparatus according to claim 12, wherein the first organic compound layer is formed extending over the entirety of the display region.

17. The stacked organic light-emitting element according to claim 10, wherein the common transparent electrode is formed extending over the entire region of the stacked organic light-emitting element.

18. The image display apparatus according to claim 12, wherein the common transparent electrode is formed extending over the entirety of the display region.

* * * * *